US010014164B2

(12) United States Patent
Druz et al.

(10) Patent No.: US 10,014,164 B2
(45) Date of Patent: Jul. 3, 2018

(54) ION BEAM MATERIALS PROCESSING SYSTEM WITH GRID SHORT CLEARING SYSTEM FOR GRIDDED ION BEAM SOURCE

(71) Applicant: Veeco Instruments Inc., Plainview, NY (US)

(72) Inventors: Boris Druz, Brooklyn, NY (US); Rustam Yevtukhov, Briarwood, NY (US); Rhodri Elliott, Ann Arbor, MI (US); James M. Best, Jr., Huntington, NY (US); Peter Porshnev, Northport, NY (US)

(73) Assignee: Veeco Instruments Inc., Plainview, NY (US)

(*) Notice: Subject to any disclaimer, the term of this patent is extended or adjusted under 35 U.S.C. 154(b) by 0 days.

(21) Appl. No.: 15/592,426

(22) Filed: May 11, 2017

(65) Prior Publication Data
US 2017/0330738 A1    Nov. 16, 2017

Related U.S. Application Data

(60) Provisional application No. 62/334,545, filed on May 11, 2016.

(51) Int. Cl.
*H01J 37/36* (2006.01)
*H01J 37/30* (2006.01)
(Continued)

(52) U.S. Cl.
CPC ........ *H01J 37/36* (2013.01); *G01R 19/16533* (2013.01); *H01J 37/3007* (2013.01);
(Continued)

(58) Field of Classification Search
USPC ..................................... 250/492.3
See application file for complete search history.

(56) References Cited

U.S. PATENT DOCUMENTS 3,156,090 A    11/1964  Kaufman
3,913,320 A    10/1975  Reader et al.
(Continued)

FOREIGN PATENT DOCUMENTS

CN    105704903 A    6/2016

OTHER PUBLICATIONS

Goodfellow et al., "An Experimental and Theoretical Analysis of the Grid Clearing Capability of the NSTAR Ion Propulsion System," Jet Propulsion Laboratory, Jun. 1999, 11 pages.
(Continued)

*Primary Examiner* — Phillip A Johnston
(74) *Attorney, Agent, or Firm* — Patterson Thuente Pedersen, P.A.

(57) ABSTRACT

Embodiments relate to a grid short clearing system is provided for gridded ion beam sources used in industrial applications for materials processing systems that reduces grid damage during operation. In various embodiments, the ion source is coupled to a process chamber and a grid short clearing system includes methods for supplying a gas to the process chamber and setting the gas pressure to a predetermined gas pressure in the range between 50 to 750 Torr, applying an electrical potential difference between each adjacent pair of grids using a current-limited power supply, and detecting whether or not the grid shorts are cleared. The electrical potential difference between the grids is at least 10% lower than the DC electrical breakdown voltage between the grids with no contaminants.

17 Claims, 14 Drawing Sheets

(51) Int. Cl.
  *G01R 19/165*   (2006.01)
  *H01J 37/32*    (2006.01)
(52) U.S. Cl.
  CPC .. *H01J 37/32018* (2013.01); *H01J 37/32944* (2013.01); *H01J 2237/18* (2013.01); *H01J 2237/335* (2013.01)

(56) References Cited

U.S. PATENT DOCUMENTS

| | | | |
|---|---|---|---|
| 4,565,618 A | 1/1986 | Banks | |
| 4,873,467 A | 10/1989 | Kaufman et al. | |
| 5,433,386 A | 7/1995 | Martin et al. | |
| 6,031,239 A | 2/2000 | Shi et al. | |
| 6,042,900 A * | 3/2000 | Rakhimov | C23C 16/272 427/249.11 |
| 6,464,891 B1 | 10/2002 | Druz et al. | |
| 6,465,780 B1 | 10/2002 | Anders et al. | |
| 6,465,793 B1 | 10/2002 | Anders | |
| 6,548,817 B1 | 4/2003 | Anders et al. | |
| 6,548,871 B1 | 4/2003 | Horita et al. | |
| 6,786,035 B2 * | 9/2004 | Stickelmaier | F03H 1/0043 313/362.1 |
| 7,557,362 B2 * | 7/2009 | Yevtukhov | H01J 27/18 118/723 I |
| 9,038,364 B2 | 5/2015 | Stickelmaier et al. | |
| 2004/0075060 A1 | 4/2004 | Luten et al. | |
| 2008/0280135 A1 | 11/2008 | Lee et al. | |
| 2010/0101947 A1 | 4/2010 | Nishimura et al. | |
| 2014/0109549 A1 | 4/2014 | Stickelmaier et al. | |
| 2014/0217022 A1 | 8/2014 | Hashaikeh et al. | |
| 2016/0027608 A1 | 1/2016 | Madocks | |

OTHER PUBLICATIONS

PCT Application No. PCT/US2017/030970, Search Report & Written Opinion dated Aug. 9, 2017.
Singapore Application No. 10201705059T, Search Report dated Feb. 27, 2018, 3 pages.
Application and File History of U.S. Appl. No. 15/631,627, filed Jun. 23, 2017, Inventors Druz et al.
Loeb et al., "Feasibility Study of Large-Scale Rf-Ion Thrusters," University Giessen , 1988, 13 pages.
Chapman, "Glow Discharge Processes," J. Wiley & Sons, 1980, p. 10.
Lieberman et al., "Principals of Plasma Discharges and Materials Processing," John Wiley & Sons, 1993, p. 450 & pp. 458-460.
Scheibe et al., "Deposition of Superhard Morphous Carbon Films by Pulsed Arc Sources," XVIIth International Symposium on Discharges and Electrical Insulations in Vacuum, Berkley, 1996, p. 941-945.
Boxman et al., "Vacuum Arc Deposition Devices," Rev. Sci. Instrum., 77, 021101 (2006), 16 pages.
Chen, "Introduction to Plasma Physics," Plenum, New York, 1974, Chapt. 2.3.3, 9 pages.
Krinberg et al., "Pinch Effect in Vacuum Arc Plasma Sources Under Moderate Discharge Currents," J. Phys. D.: Appl. Phys. 35(2002) 549-562.

* cited by examiner

FIG. 3C

| Grid Clear Enable Bit | Grid Select Bit | Switch 330 (K1) | Switch 331 (K2) | Screen Grid Connection | Accelerator Grid Connection | Decelerator Grid Connection | Purpose |
|---|---|---|---|---|---|---|---|
| 0 | 0 or 1 | Off | Off | Screen Grid Power Supply | Accelerator Power Supply | Ground | Conventional Operation (Grid Clear Circuit Disabled) |
| 1 | 0 | Off or On | On | Grid Clear Power Supply | Ground | Ground | Clear Shorts between Screen and Accelerator Grids |
| 1 | 1 | On | Off | Grid Clear Power Supply | Grid Clear Power Supply | Ground | Clear Shorts between Accelerator and Decelerator Grids |

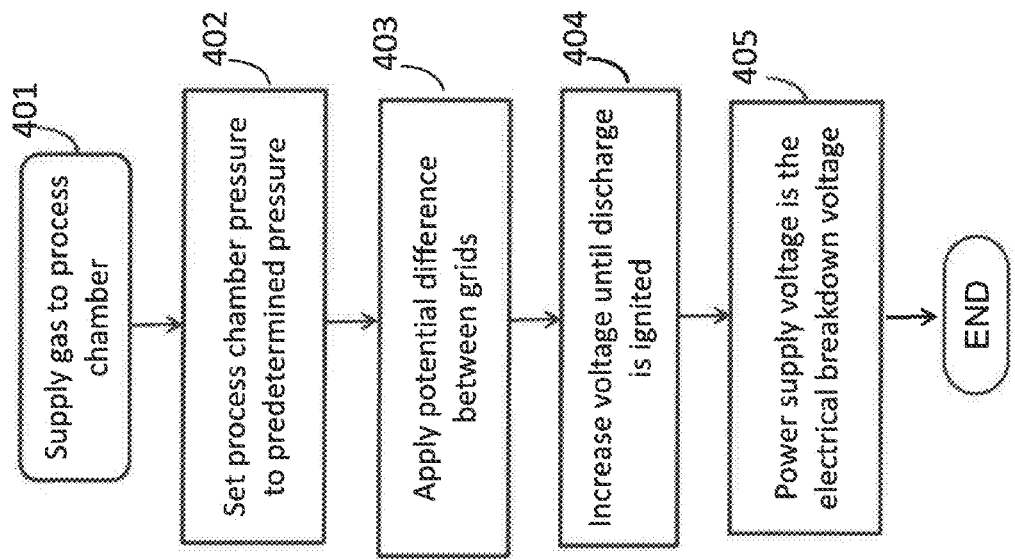

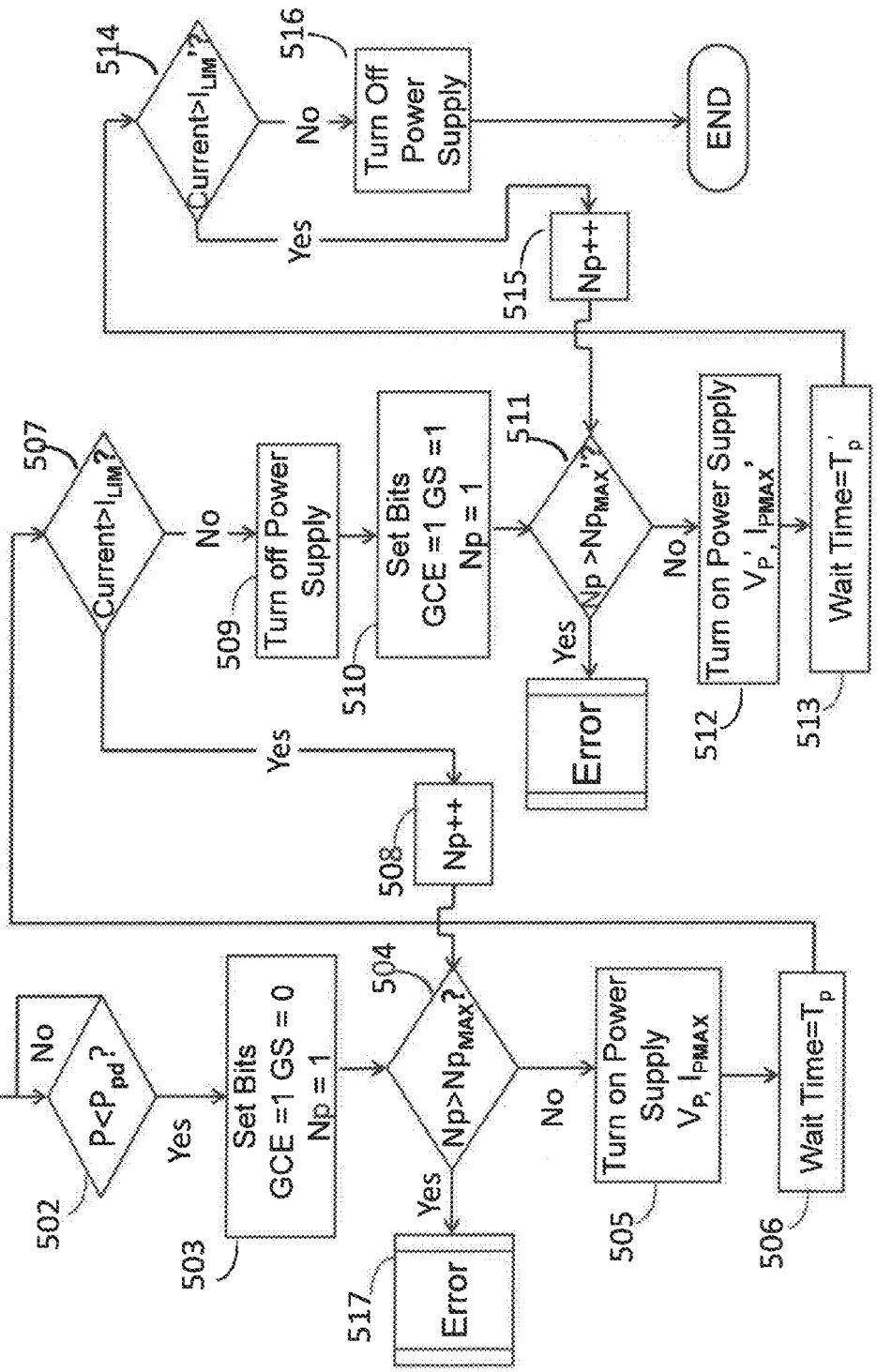

FIGURE 5C

| SS wire dia. | Test# | Pulse | | Resistivity, Ohm | | Accel. Grid Temp. | | Cleared? |
|---|---|---|---|---|---|---|---|---|
| | | T, s | Imax, A | Before Pulse | After Pulse | Before Pulse | After Pulse | Y/N |
| 0.0045" | 1 | 1 | 1 | --- | --- | 17.6 C | 18.5 C | Y |
| | 2a | 1 | 1 | 1 ohm | 18 ohm | 18 C | 18 C | N |
| | 2b | 1 | 1 | 18 ohm | 79 ohm | | | N |
| | 2c | 1 | 2 | 79 ohm | 0.7 Kohm | 17.9 C | 23 C | Y |
| | 3 | 1 | 2 | 1 ohm | 0.7 Kohm | 18 C | 24 C | Y |
| | 4 | 1 | 2 | 1.9 ohm | 0.7 Kohm | 18 C | 22 C | Y |
| | 5 | 1 | 2 | 13 ohm | 0.7 Kohm | 18.2 C | 24 C | Y |
| | 6 | 1 | 2 | 0.62 ohm | 0.7 Kohm | 18.7 C | 22 C | Y |
| | 7 | 1 | 2 | 1.2 ohm | 0.7 Kohm | 18.9 C | 28 C | Y |
| | 8 | 1 | 2 | 0.7 ohm | 0.7 Kohm | 19.1 C | 38 C | Y |

FIGURE 5D

| SS Wire dia. | Test # | Pulse T, s | Pulse Imax, A | Resistivity, Ohm Before Pulse | Resistivity, Ohm After Pulse | Accel. Grid Temp. Before Pulse | Accel. Grid Temp. After Pulse | Cleared? Y/N |
|---|---|---|---|---|---|---|---|---|
| 0.009" | 1a | 1 | 2 | 1 ohm | 1 ohm | 18.2 C | 18.5 C | N |
| | 1b | 1 | 2 | 1 ohm | 1 ohm | 18.2 C | 18.5 C | N |
| | 1c | 1 | 2 | 1 ohm | 1 ohm | 18.2 C | 18.5 C | N |
| | 1d | 1 | 3 | 1 ohm | --- | 19.2 C | 20.3 C | N |
| | 1e | 1 | 3 | --- | 0.7 Kohm | 18.5 C | 22.6 C | Y |
| | 2a | 1 | 3 | 0.44 ohm | --- | 18.3 C | 20.4 C | N |
| | 2b | 1 | 3 | --- | 0.7 Kohm | 18.2 C | 30 C | Y |
| | 3a | 1 | 3 | 1.5 ohm | 3.5 ohm | 18.3 C | 19.4 C | N |
| | 3b | 1 | 3 | 3.5 ohm | 3.1 ohm | 18.3 C | 19.6 C | N |
| | 3c | 1 | 3 | 3.1 ohm | 7.4 ohm | 18.4 C | 20 C | N |
| | 3d | 1 | 3 | 7.4 ohm | 2.2 ohm | 18.3 C | 18.6 C | N |
| | 3e | 1 | 3 | 2.2 ohm | 6.4 ohm | 18.3 C | 19.2 C | N |
| | 3f | 1 | 4 | 6.4 ohm | --- | 18.3 C | 21.3 C | N |
| | 3g | 1 | 4 | --- | 0.7 Kohm | 18.2 C | 25 C | Y |
| | 4a | 1 | 4 | 0.3 ohm | --- | 18.5 C | 20.4 C | N |
| | 4b | 1 | 4 | --- | 0.7 Kohm | 18.3 C | 31.2 C | Y |
| | 5a | 1 | 4 | 6.4 ohm | --- | 18.3 C | 22.6 C | N |
| | 5b | 1 | 4 | --- | 0.7 Kohm | 18.3 C | 33.6 C | Y |

FIGURE 5E

| SS Wire 0.009" | Shim Thickness | Pulse | | Test# | Accel. Grid Temp. | | Cleared? |
|---|---|---|---|---|---|---|---|
| | | T, sec | Imax, A | | Before Pulse | After Pulse | Y/N |
| | 0.004" | 1 sec | 4 A | 1 | 18.6 C | 48 C | Y |
| | 0.008" | 1 sec | 4 A | 2 | 18.7 C | 53 C | Y |
| | 0.012" | 1 sec | 4 A | 3 | 18.8 C | 18.8 C | N |
| | 0.008" | 1 sec | 4 A | 4 | 19 C | 42 C | Y |
| | 0.012" | 1 sec | 4 A | 5a | 18.8 C | 18.8 C | N |
| | 0.012" | 1 sec | 4 A | 5b | 18.3 C | 18.3 C | N |
| | 0.012" | 1 sec | 4 A | 5c | 18.3 C | 18.3 C | N |
| | 0.012" | 1 sec | 4 A | 5d | 18.2 C | 18.2 C | N |
| | 0.008" | 1 sec | 4 A | 6 | 18.9 C | 33 C | Y |

ION BEAM MATERIALS PROCESSING SYSTEM WITH GRID SHORT CLEARING SYSTEM FOR GRIDDED ION BEAM SOURCE

CROSS-REFERENCE TO RELATED APPLICATION

This application claims the benefit of U.S. Provisional Application 62/334,545, filed May 11, 2016, the contents of which are incorporated by reference herein in their entirety.

TECHNICAL FIELD

The invention relates generally to the field of ion beam materials processing systems, and more particularly to ion beam systems with gridded broad-beam ion sources for ion beam deposition and etching.

BACKGROUND

Ion beam systems with gridded broad-beam ion sources are used for various surface modification, etching and deposition applications. Ion beam processes that provide a source of charged particles are particularly advantageous compared to other methods for providing direct control of ion energy and flux and angle of incidence to the substrate, and isolation of the substrate from the conditions of the reactor used to generate the etching and or depositing species. Broad-beam ion sources have numerous applications in microelectronics device fabrication. Ion beam equipment is extensively used in the production of high frequency microwave integrated circuits and thin magnetic heads.

An early version of a direct-current (DC) ion source for industrial applications is described in U.S. Pat. No. 3,913,320. This type of ion source was developed originally for space propulsion as disclosed in U.S. Pat. No. 3,156,090. Various modifications of such ion sources have been developed to optimize the efficiency of the ion source and to improve the method of extracting the ions or shaping the beam profile for ion beam etching and deposition applications. See, for example U.S. Pat. No. 4,873,467. Typically, these DC ion sources use a heated cathode configured as either a heated filament or hollow cathode.

Ion sources with filament type cathodes are easier to operate, but require frequent replacement of the filament assembly. Furthermore, the hot filaments rapidly degrade in the plasma state by interaction with gases such as hydrocarbons, oxygen, hydrogen, and fluorinated gases which are useful for thin film deposition. The shortcomings of these kinds of DC ion sources hinder the implementation of ion beam processes in manufacturing processes.

The disadvantages of DC ion sources can be avoided by using radio frequency (RF) charged particle sources which employ high frequency electromagnetic energy for ion generation, such as from microwave energy sources. RF inductively coupled ion sources also were originally developed for space propulsion. An example of an RF ion source that uses an axial RF coil is described by H. W. Loeb, "State of the Art of the RIT-Ion Thrusters and Their Spin-Offs," (1988). In contrast with DC sources, many RF sources do not have discharge electrodes in direct contact with the plasma.

In many broad-beam ion source designs, a grid assembly with two or more grids is used to extract the ion beam from the ion source and direct it to the target. One general limitation of conventional gridded ion beam sources in practical applications is the formation of electrical shorts between the grids that cause instabilities and limit the operational life of the ion source. These shorts are usually developed due to deposits on the grids formed as a result of material erosion inside of the source and the chamber. Direct deposition on the grids can create needle-like deposits (herein also simply referred to as "needles") that, although not dead shorts, can locally reduce the effective breakdown voltage, and may cause high voltage arcs or shorts. Accumulation of sputtered material on other surfaces, such as the process chamber shields, may build up to a sufficient thickness of material within the chamber that flakes off and the flakes become lodged between grids, thereby causing dead shorts.

Conventional grid short clearing (also simply referred to as "grid clearing") techniques have been developed for xenon gridded ion thruster technology used in planetary missions by NASA, such as those described in U.S. Pat. Nos. 6,786,035 and 9,038,364. In a publication on grid clearing for the NSTAR ion propulsion system, a low voltage "grid clear" circuit applies a first energy between grids at a first voltage, and a high voltage grid clear circuit applies a second energy at a second voltage higher than the first voltage; Keith D. Goodfellow et al., "An Experimental and Theoretical Analysis of the Grid Clearing Capability of the NSTAR ion propulsion System," $35^{th}$ AIAA/ASME/SAE/ASEE, Joint Propulsion Conference and Exhibit; Jun. 20-24, 1999; Los Angeles, Calif.

Methods for clearing electrical shorts in space-based ion thruster applications must accommodate the associated low pressure (high vacuum) conditions ($\sim 10^{-9}$-$10^{-5}$ Torr). The low voltage grid clear circuit can remove electrical shorts by passing sufficient current through the flakes or other deposits between grids to cause them to sublime, but this approach requires a continuous conductive path. It is ineffective for removing electrical shorts that appear only at the higher voltage operating conditions of the ion source, such as the "needles" and other deposits on the grids that do not create a dead short. Even when the grid assembly is considered to be clear after such a high vacuum clearing operation, if another grid-clearing pulse is delivered, electrical shorts between the grids may reappear due to residual flakes or needles reforming conducting paths on one or both grids. For these reasons, conventional grid-clearing methods often provide for a second energy pulse at higher voltage to be applied to generate an arc plasma that creates a low resistance path through any short circuit to enable a current flow sufficient to clear any residual shorts.

At the low pressure conditions of the ion thrusters for which the conventional grid clearing methods were developed, generation of a high voltage arc plasma requires ignition of a vacuum cathodic arc. The conditions associated with creation of a vacuum cathodic arc include initial conductivity between grids and sufficient energy to ignite the vacuum arc. A vacuum cathodic arc is distinguished by the creation of an ionized plasma composed of material ejected from the negatively charged grid surface, which may include material of the grid itself. Generation of such vacuum cathodic arcs may lead to significant local non-uniform temperature increases and strong grid erosion that is damaging to the grid. The grid erosion caused as a result reduces the grid life time and makes it difficult to clean and rebuild the grid assembly. In some cases, "needles" and other deposits on the grids may not appear as shorts and thus may not be effectively removed under the low pressure (high vacuum) grid clearing operations used for space-based thrusters, but under the higher working pressures of typical industrial applications for materials processing systems ($\sim 10^{-4}$-$10^{-3}$ Torr) these kinds of deposits can still can cause electrical shorting and instability during operation of the ion source.

Aside from the operating pressure, there are many other differences between the operating conditions which make the grid clearing techniques for ion thrusters generally inapplicable to ion sources used in industrial applications for materials processing systems. For example, because ions from an ion thruster are ejected into outer space, grid shorts are generated mainly from deposits of material sputtered at relatively low energy from the interior of the ion source, and are therefore relatively infrequent. Whereas, in an ion beam materials processing system, the ion beam cannot escape from the process chamber, resulting in heavy sputtering at comparatively high ion beam energies, which results in generation of a much larger load of flakes and other debris that can short the grids. Hence, the need for grid clearing may be expected to be much more frequent, and any cumulative damage from the grid clearing operation may be more critical in an ion source than for an ion thruster. In general, industrial applications of gridded ion beam sources require less aggressive grid short clearing techniques in order to reduce the potential for grid damage and to provide improved ion beam source operational life, increased grid assembly service life, and increased number of the grid rebuilds before replacement.

There is a continuing need for methods and apparatus for clearing electrical shorts between ion source grids used in industrial applications for materials processing systems due to deposits on the grids, such as "flakes" or "needles" with no or minimal damage to the grids. Accordingly, it would be desirable to provide an ion beam materials processing system with a gridded ion source having a grid short clearing system capable of providing long operational grid life.

SUMMARY

In various embodiments, a grid short clearing system is provided for gridded ion beam sources used in industrial applications for materials processing systems. The grid short clearing system effectively removes electrical shorts between grids caused by the presence of grid contaminants such as flakes and needle-like deposits between adjacent grids.

In various embodiments, a grid short clearing system includes methods for supplying a gas to an ion source coupled to a process chamber, setting the gas pressure in the chamber to a predetermined pressure ranging between about 50 Torr to about 750 Torr, applying an electrical potential difference for a period of time between each adjacent pair of grids using a current-limited power supply, and detecting whether or not the grid shorts are cleared. To avoid grid damage due to direct electrical discharge between the adjacent grids, the electrical potential difference is maintained at least 10% lower than the DC electrical breakdown voltage between the adjacent grids in the absence of the above-mentioned contaminants. Grid damage is further avoided by limiting the power supply current to about 15 A or less and the duration time of the applied potential difference to about 10 s or less.

In various embodiments, an ion beam system includes grid short clearing apparatus for an ion source equipped with multi-grid ion optics coupled to a process chamber. The grid short clearing apparatus includes a gas supply for supplying gas to the process chamber, the gas pressure being in a range between about 50 Torr to about 750 Torr, and a grid short clearing circuit including one or more primary power sources for conventional ion beam operation and a secondary power source for clearing grid shorts coupled to a switching circuit. The secondary power source is controlled by an electrical control system configured to generate a potential difference between adjacent grids operable from least 40 V up to a maximum voltage potential difference used for grid short clearing. In one embodiment for a multi-grid ion source, the electrical control system for the grid assembly includes switching circuits to apply the grid clear voltage to any of at least two grids.

In various embodiments, a software-driven grid clear control system uses a conventional DC power supply to generate the electrical potential difference. In another embodiment, a pulsed DC power supply capable of generating a train of voltage pulses is utilized.

These and other embodiments and advantages of the present invention will be further described and more readily apparent from a review of the detailed description and preferred embodiments which follow.

BRIEF DESCRIPTION OF THE DRAWINGS

The invention may be more completely understood in consideration of the following detailed description of various embodiments in connection with the accompanying drawings, in which:

FIG. 3C is a summary table distinguishing various circuit configurations for the grid clear circuitry of FIGS. 3A and 3B, in terms of the software settings, electrical switch positions, and grid connections.

FIG. 4 is a flowchart illustrating an example method for determining the breakdown voltage for glow discharge between adjacent pairs of grids with no contaminants.

FIG. 4A is a flowchart illustrating an example method to clear electrical shorts from a 3-grid ion optic assembly according to embodiment of the invention.

FIG. 5C shows the effect of electrical pulses applied to a short (wire with dead short) between two grids using the grid clear method on the grid temperature and the resistivity using a 0.0045" stainless steel wire.

FIG. 5D shows the effect of electrical pulses applied to a short (wire with dead short) using the grid clear method on the grid temperature and the resistivity using a 0.0090" stainless steel wire.

FIG. 5E shows the effect of current pulses applied to a "needle-like" electrical short (wire with a gap) using the grid clear method on the grid temperature and on the success of the grid clearing process, for different thickness shims that define the gap between the tip of the grounded wire and the surface of the electrically charged grid.

Figure 1:
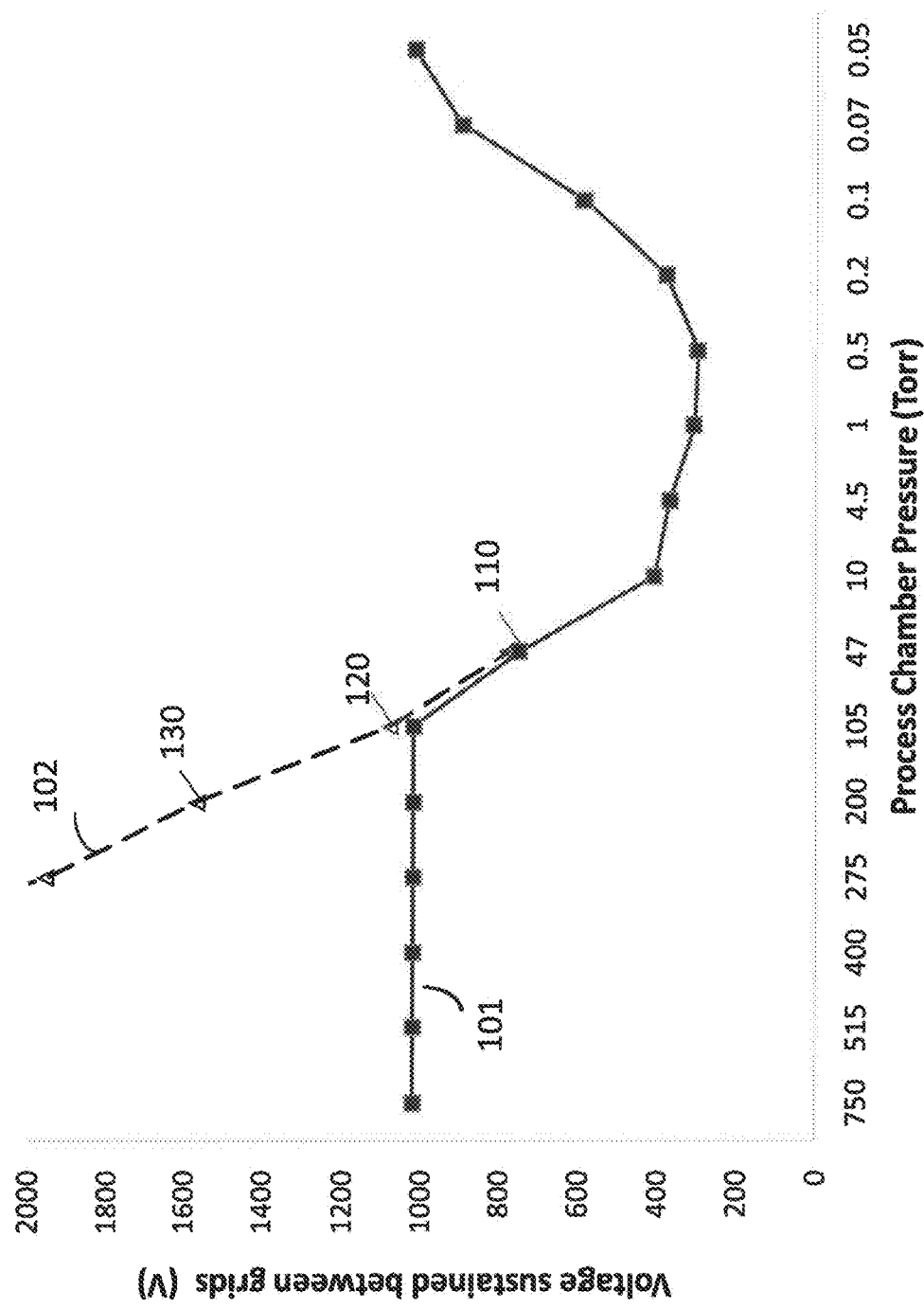
FIG. 1 depicts the pressure dependence of the voltage difference sustainable between two grids according to an embodiment, illustrating the usable pressure range for the implementation of an embodiment of the invention and the breakdown voltage for gas discharge between grids with no contaminants at various pressures in the usable pressure range.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments herein generally relate to circuits, systems, and methods for clearing electrical shorts formed in ion beam materials processing system grids. In contrast to conventional grid clearing circuits, systems, and methods designed for ion thrusters, the circuits, systems, and methods of the present disclosure are able to effectively clear short circuits obtained under the conditions of ion beam materials processing systems with minimal or no damage to the grids.

To overcome the limitations and disadvantages of conventional methods, the present disclosure provides the conductive path needed for clearing high resistivity grid shorts such as "needles," loose flakes, or other grid deposits in the gap using a limited energy, low damage glow discharge plasma, instead of a vacuum cathodic arc. Vacuum cathodic arc formation is associated with localized melting and crater formation on the surface of the cathode; the plasma is sustained by the ionization of the ejected cathode material. In contrast, the glow discharge plasma is generated by ionization of gas molecules; it is associated with mild cathode heating, and erosion by sputtering, a layer by layer removal process. Thus the various embodiments of the grid short clearing system for an ion source provide for a more controlled and less damaging process than conventional systems using a cathodic arc discharge.

Glow discharge plasmas are created by electron impact ionization of neutral gas atoms or molecules. Direct current (DC) glow discharges are created by applying a sufficient voltage difference between two spaced-apart electrodes immersed in a gaseous environment. The glow discharge becomes unsustainable when the gas density is so low that there few neutrals available for ionization along the relevant path length "d" for the plasma to be generated, or when the gas density is so high that efficient ionization is inhibited by frequent energy-depleting collisions. In general, between these two regions there is a range of pressure for a given electrode spacing where the breakdown voltage is relatively low (less than 1000V).

Simple consideration based on comparison of the mean free path (mfp) of the gas species with the distance "d" can provide a rough estimate of the general conditions for generating a sustainable glow discharge at a relatively low breakdown voltage. At low gas density (low pressure), there are few gas collisions within the discharge length, i.e. the mfp length is significant compared to "d," approximately ⅕ or more. Contrarily, at high gas density (high pressure), i.e., too frequent collisions, the mfp is much less than "d," e.g., the mfp is reduced by a factor of approximately 10 or more. In various embodiments, an optimum condition may be when the mfp is between 0.1 to 0.2 times the discharge length "d."

The discharge length "d" for a high resistance flake, needle, or other grid short is not well-defined, but is generally a fraction of the grid spacing, which is on the order of about 1 mm. From the above consideration, in some embodiments the ideal mean free path (mfp) may be between 0.1 mm to 0.2 mm for a 1 mm discharge length. The mfp is inversely proportional to the gas density (pressure) and the atomic collision area (cross-section). Assuming a simple hard collisional model for an atomic gas and a typical atomic diameter of 3 Angstroms (A), the approximate collision cross-section corresponds to a radius of 3 A (see, e.g., B. Chapman, "Glow Discharge Processes," J. Wiley & Sons, 1980, p. 10). The corresponding pressure range (ideal gas at room temperature) is approximately 0.5 Torr to 1 Torr for 1 mm discharge length. Grid short discharges spanning shorter gaps would require smaller mfps and thus higher pressures.

A more detailed theoretical treatment for predicting the gas discharge breakdown voltage "$V_b$" as a function of pressure "P" and spacing "d" has been described (M. A. Lieberman, et al, ("Principals of Plasma Discharges and Materials Processing," John Wiley and Sons, Inc., 1994, p. 458); however, such approaches present increased difficulties and require knowledge of the electron-neutral ionization cross-section, which is not easily determined in a glow discharge. A semi-empirical formula, which relies on experimentally fit gas-dependent empirical constants, represents $V_b$ as a function of the product "Pd." Data for air (M. A. Lieberman, et al, p. 460, FIG. 14.4) indicate that low $V_b$ (less than about 1 kV) is obtained in a range of "Pd" between ~1 Torr-mm and 100 Torr-mm. Thus, a gas discharge of 1 mm length in air can be expected over a range from about 1 Torr to 100 Torr. For grid shorts associated with shorter length discharges between two grids this suggests the optimum pressure may be well over 100 Torr.

These calculations ignore effects of differences in electrode materials, in particular, differences that can affect the secondary electron emission coefficient, an important contributing factor for establishing the conditions for a self-sustaining plasma. They also assume simple parallel plate electrodes, whereas grids for a broad beam gridded ion source are perforated with apertures having edges. Structures formed by grid shorts are irregular and therefore may be very far from these ideal assumptions.

Grid short clearing systems according to various disclosed embodiments also may be operated outside conditions where direct electrical breakdown between the grids (grid-grid plasma discharge), in the absence of contaminants, may occur. These conditions depend on the grid assembly design, particularly the grid spacing, as well as the gas composition and pressure. When the conditions permit such an electrical breakdown, the power of the grid clearing circuit will not be efficiently focused on the local areas of electrical shorting; grid heating, and erosion from sustained discharges between the grid surfaces also can damage the grids.

Practical conditions for grid clearing according to various disclosed embodiments can be found for each pair of grids of a given design by determining the breakdown voltage $V_b$ for the grid-grid discharge for a range of gas pressures. Experimental determination of the breakdown voltage at any given pressure can be done, for example, using various embodiments of the ion beam processing and grid clearing apparatus with a pair of grids with no contaminants by the method described in FIG. 4. Essentially, a potential difference is applied between the grids, and the voltage raised until a discharge is ignited. Ignition of a discharge can be indicated by various means, for example, when a current-limited power supply reaches maximum current at some voltage below the programmed voltage.

FIG. 1 illustrates the results of performing such an evaluation in air for a pair of grids with 1 mm grid spacing. The experimental results, indicated by curve 101 (square data markers connected by a solid line), were obtained for a power supply limited to a maximum voltage of 1 kV, which is a typical potential difference used for grid clearing. It is observed that a grid-grid discharge can be ignited with a breakdown voltage less than 1 kV for a range of pressure from ~0.05~0.1 Torr to 50~100 Torr. In various embodiments, this pressure range may be avoided for clearing grid shorts using 1 kV or higher voltages. At lower pressures (below ~0.05 Torr) there is an insufficient density of gas atoms to sustain a low voltage gas discharge within the grid gap. As described above, this low pressure range is also unsuitable for grid clearing, since any discharge in this range may result in cathodic arc conditions associated with grid material erosion and damage. Above 50~100 Torr, the breakdown voltage exceeds the 1 kV limit of the power supply, so this is an appropriate pressure range for clearing grid shorts. There is no obvious high pressure limit. Actual grid short clearing tests have shown that effective low damage clearing of grid can be performed for grids with different grid spacing at pressures up to, and including, one atmosphere. Dead shorts and long "needles" or loose flakes can be cleared, with relatively low voltages and currents, at atmospheric, or close to atmospheric, pressure. Clearing relatively small amounts of deposition or short "needles" from the surface of a grid may be more efficiently done at significantly lower pressures (e.g. ~100-300 Torr), which corresponds to discharge lengths close to the grid spacing.

In various embodiments, grid clearing is performed at a reduced pressure between approximately 50 Torr to about 750 Torr. Open atmospheric conditions generally are not used in manufacturing as charging grids at high voltage and power at atmosphere is a safety hazard to operators of the ion beam equipment and introduces potential processes variations due to differences in environmental conditions, e.g., humidity and dust.

This same general grid clearing pressure range (about 50-750 Torr) may be specified for other multi-grid designs and gas compositions, provided that in each case the potential difference between the grids is kept below the electrical breakdown potential for the grid-grid glow discharge process.

Referring again to FIG. 1, the breakdown voltage in air for a simple pair of planar electrodes with 1 mm grid spacing in the pressure range of interest is shown by curve 102 (dashed line with open triangle markers). This curve is based on the corresponding curve in the aforementioned FIG. 14.4 of Lieberman, et al. The results are in remarkably good agreement with the experimental data for the grids in the higher pressure range as indicated by points 110 and 120 on the dashed line curve. Extrapolation of the breakdown voltage to the higher pressure is nearly linear with pressure, as theoretically expected. At about 100 Torr the breakdown voltage $V_b$ is ~1000V (point marked 120 on the dashed line curve), at 200 Torr, $V_b$ is about 1570V (point marked 130 on the dashed line curve).

It is notable that the sub-mTorr pressures obtained in conventional grid clearing methods used for ion thrusters are far below the pressure ranges indicated above and therefore cannot be expected to sustain a gas discharge plasma between grids.

Figure 2:
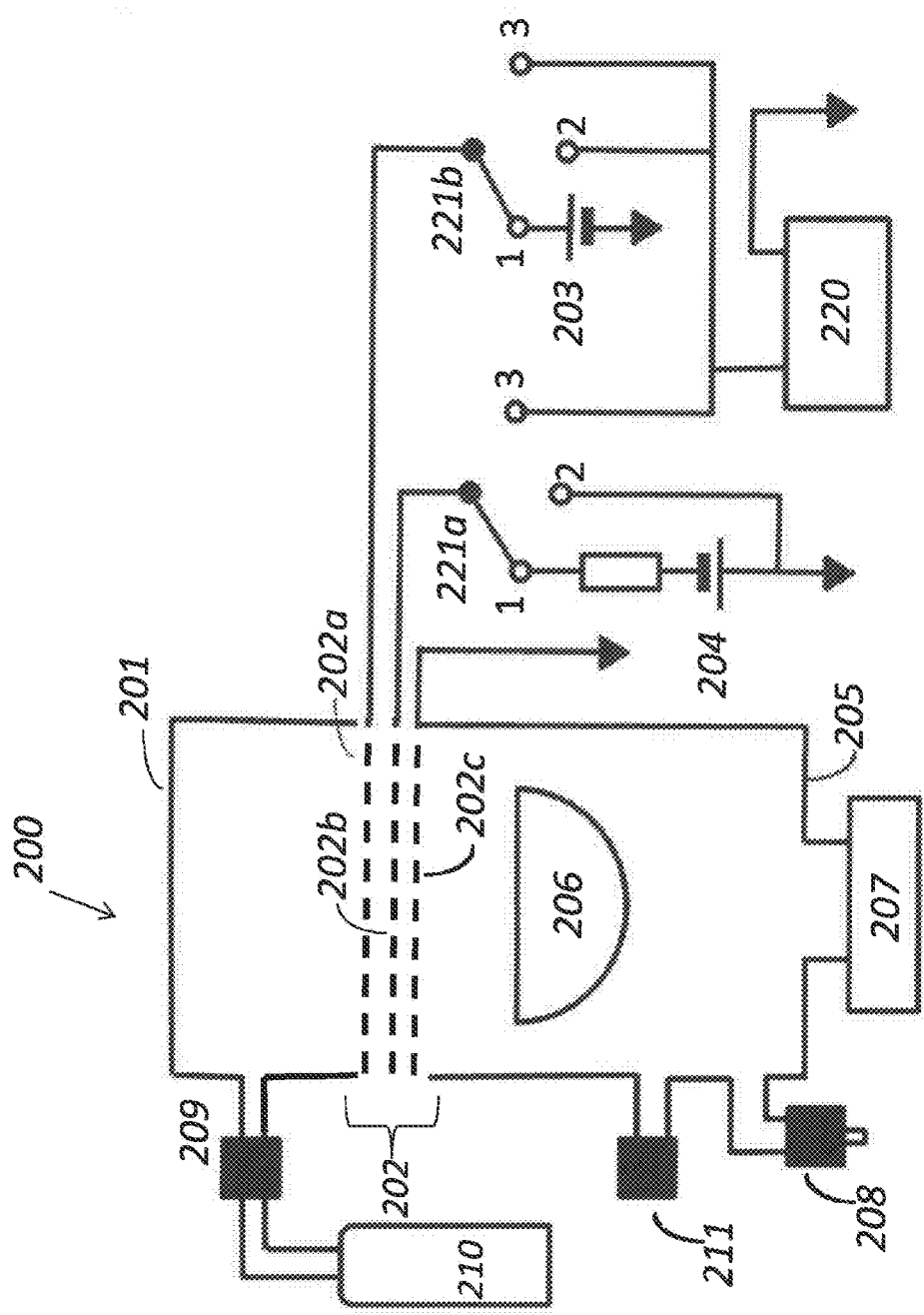
FIG. 2 is a functional block diagram for implementation of an embodiment ion source with 3-grid ion optics.

Referring to FIG. 2, a block diagram and schematic of an example ion beam materials processing and grid clearing system 200 of the invention is shown. As shown, an ion beam source 201 includes an ion optic assembly 202 (herein also simply referred to as a grid assembly) comprising three grids 202a-202c. The ion beam source 201 and other features of system 200, may be, for example, as those previously described in some detail in U.S. Pat. No. 7,557,362 to Yevtukhov et al, which is herein incorporated by reference in its entirety. The grid closest to the plasma, 202a is generally known in the literature as the "screen" grid, and is operated at a positive electrical potential for ion beam extraction, e.g. by direct connection to a beam operating power supply 203. The intermediate grid, 202b, is generally known as the "accelerator" grid and is operated at a negative electrical potential for ion beam extraction, by connection to an acceleration operating power supply 204. The grid furthest from the plasma, 202c, is generally known as the "decelerator" grid, and it is usually connected to the system electrical ground, as shown. Power supplies 203 and 204 are the primary power sources used for conventional ion beam operation.

The ion beam source 201 is coupled to a process chamber 205 in a manner such that the ion beam extracted from the ion optics is directed to a work piece mounted in an ion beam path, such as a substrate fixture 206, which is used, e.g., for ion beam etching, or a target fixture (not shown), which can be used for ion beam sputter deposition of a target material onto a substrate mounted elsewhere. To operate at reduced pressure conditions, the ion beam source and process chamber 205 to which it is mounted are sealed from atmosphere, and provided with at least one vacuum pump 207. A vent valve 208 is provided to return the process chamber 205 to atmosphere. At least one gas controller 209 connected to a gas supply 210, and a vacuum pressure gauge 211 are provided to further control the pressure in the ion beam source 201 and the process chamber 205. These above-described features are common to conventional ion beam materials processing systems and thus descriptions of their operation and design are omitted herein except where necessary for an understanding of the present disclosure. Such systems are operable between relatively high vacuum pressures to atmosphere. For example, during process, conventional ion beam materials processing systems are generally operated in a range of ~$10^{-4}$ Torr to less than 1 mTorr. Additionally, these systems are periodically vented to atmosphere to change substrates (e.g., in an air-to-air system) or for modifications or repairs, and are not normally operated in the intermediate pressure range between 1 mTorr and 1 atmosphere.

In one embodiment, system 200 can comprise a secondary power source, grid clear power supply 220, and switches 221a and 221b which, when the grid clear operation is performed, disconnect the grids from the operating power supplies 203 and 204 and connect them either to the grid clear power supply 220 or to the electrical ground of system 200. For example, referring now to FIG. 2, in a reference configuration corresponding to a conventional circuit for ion beam operation, indicated by the switches 221a and 221b being in reference position 1, the grids are connected to their respective operating supplies and the grid clear power supply is disconnected. More specifically, the screen grid 202a is connected to the ion beam voltage supply 203 and the accelerator grid 202b is connected to the accelerator power supply 204. This configuration is used for routine end-use operation of the ion beam system.

In general, a grid short clearing circuit in accordance with various embodiments is configured to be capable of applying a high voltage difference between each adjacent pairs of grids, e.g., grids 202a-202c, at a gas composition and pressure determined by gas controller 209, vacuum pump 207, and vent valve 208. In one embodiment, clearing of grid shorts in the "acceleration gap" between the screen grid 202a and the accelerator grid 202b is done by grounding the accelerator grid 202b and connecting the screen grid 202a to the grid clear power supply 220. This is indicated by both switches 221a and 221b being in position 2. To clear grid shorts in the "deceleration gap" between the accelerator grid 202b and the decelerator grid 202c, screen grid 202a and accelerator grid 202b are both connected to the grid clear power supply 220, as shown by switches 221a and 221b both being in position 3.

Figure 3A:
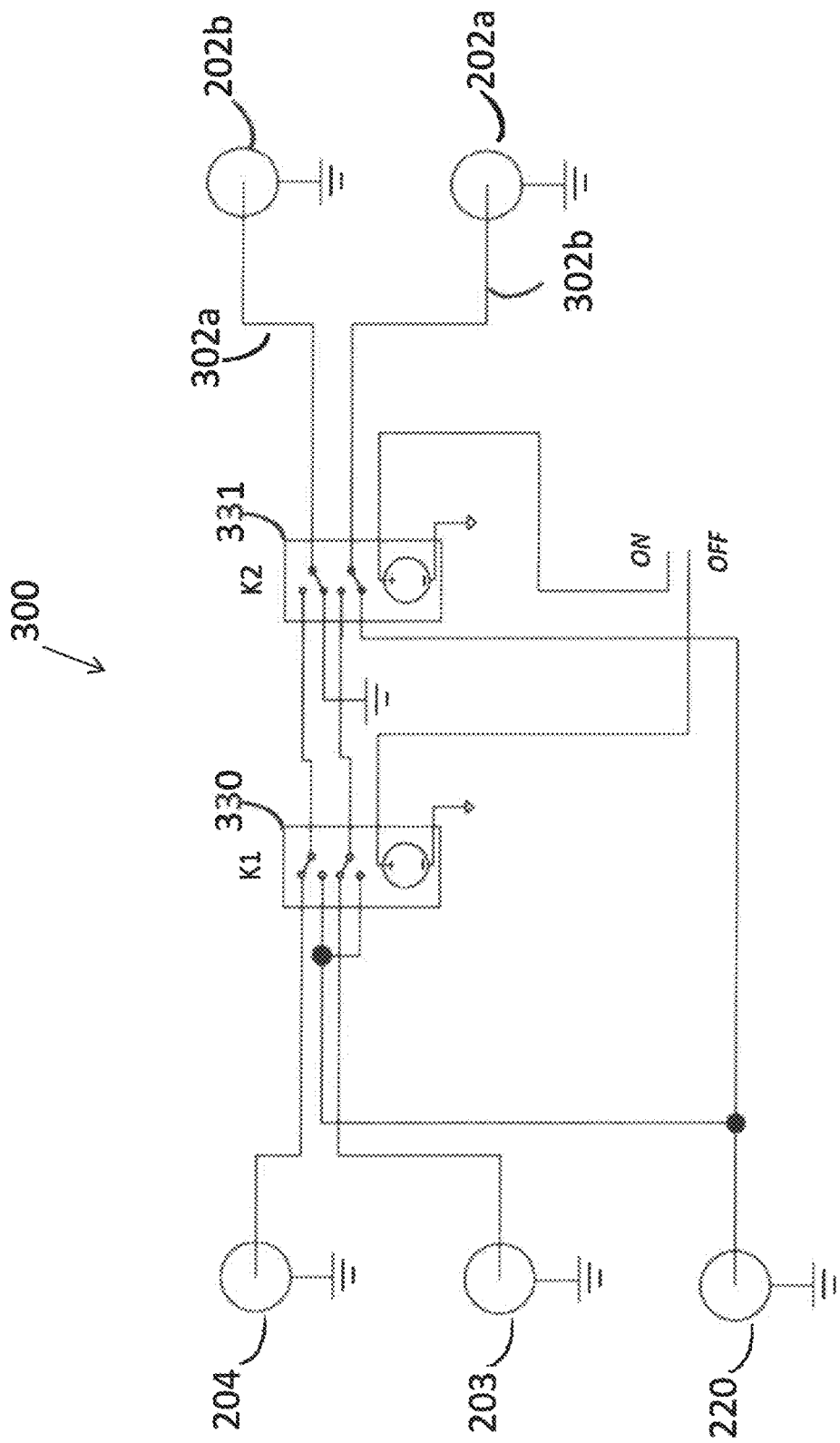
FIG. 3A is a schematic circuit diagram according to an embodiment, illustrating the configuration for clearing grid shorts between a screen and accelerator grid in a 3-grid ion optic assembly.
Figure 3B:
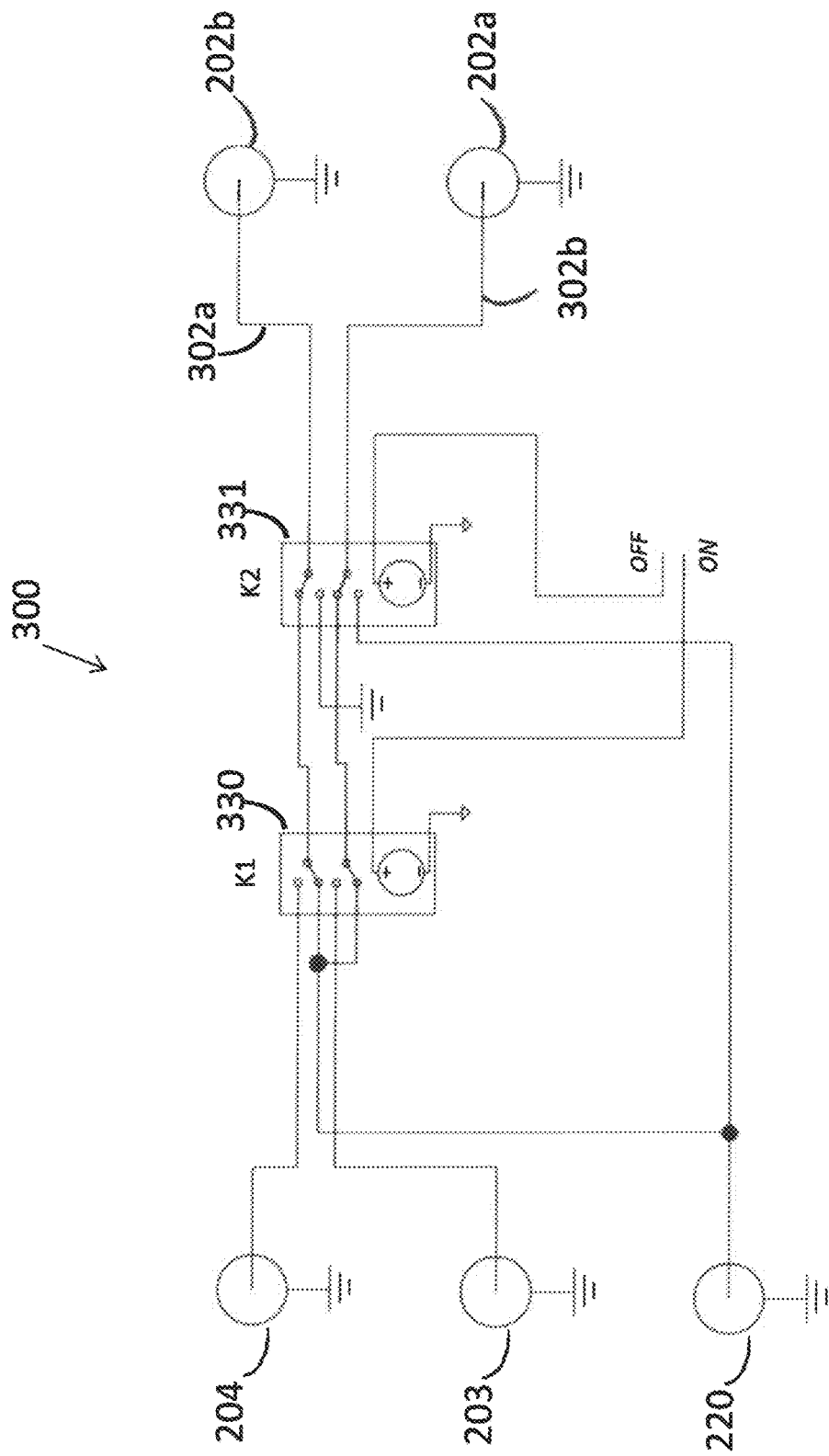
FIG. 3B is a schematic circuit diagram for another embodiment, illustrating the configuration for clearing grid shorts between an accelerator and a grounded decelerator grid in a 3-grid ion optic assembly.

Referring to FIGS. 3A and 3B, a grid clear circuit 300 is shown according to an embodiment. Power supplies 203, 204, and 220, and grids 202a and 202b correspond to the like-numbered power supplies and grids described in FIG. 2. Grid contacts 302a and 302b connect to grids 202a and 202b. Two high voltage, high current rated double-pole double-throw switches 330(K1) and 331(K2) are controlled by software using two control bits named "Grid Clear Enable" (GCE) and "Grid Select" (GS) bits. When the GCE bit is set to 0, the grids are connected to their operating supplies and the grid clear power supply is disconnected, as in the reference configuration (switch position 1) described in the discussion of FIG. 2; switches 330 and 331 are turned off. When the GCE bit is set to 1 and the GS bit is set to 0, as shown in FIG. 3A, switch 331 is turned ON; as a result, the accelerator grid 202b is grounded and the screen grid 202a is connected to the grid clear power supply. This establishes a voltage difference in the acceleration gap between the screen grid 202a and the accelerator grid 202b, corresponding to switch position 2 in FIG. 2. In this case, switch 330 may be turned OFF (as shown in FIG. 3A) or ON, it doesn't affect the grid connections. When the GCE bit is set to 1 and the GS bit is set to 1, as shown in FIG. 3B, switch 330 is turned ON and switch 331 is turned OFF; as a result, the screen grid 202a and the accelerator grid 202b are both connected to the grid clear power supply 220 and a voltage difference is established in the deceleration gap between the accelerator grid 202b and the grounded decelerator grid 202c. This corresponds to switch position 3 in FIG. 2. FIG. 3C is a table summarizing the switch status and grid connections for the different switch settings of the circuit design in FIGS. 3A and 3B.

The grid clear power supply 320 may be a positively charged DC supply rated to a voltage equal to or greater than the maximum grid voltage rating (typically ~1 kV-2 kV) and a current greater than the average current sufficient for effective grid clearing, which is typically between approximately 1 A-15 A. According to one embodiment of the method of the invention, in which software is used to generate a grid clearing "pulse" by turning the power supply on and off, it may be a conventional DC power supply. According to another embodiment, a programmable pulsed DC power supply can be used to generate one or a sequence (train) of grid clear "pulses" upon being turned on by the software. High power relay switches 330 and 331, rated for the power, voltage, and current to be handled, are readily available from commercial suppliers.

Controls used to turn switches 330 and 331 on and off according to the GCE and GS bits are well known in the art and are therefore not shown in FIG. 3. For example, this may be accomplished by connection of the switch power input to a 24V power supply through low voltage single pole single throw switches.

According to other embodiments, other circuitry may be used to achieve the same purpose. For example, the polarity of the voltage applied can be reversed (which may be beneficial depending on the type of grid short) by reversing the grounded and charged grid potentials, or using a negatively charged power supply instead of a positively charged power supply.

In clearing shorts from multi-grid ion optic assemblies, it is generally possible that multiple pairs of grids (such as adjacent pairs 202a-202b and pair 202b-202c) may be energized simultaneously. The circuits shown in FIGS. 2 and 3 are designed to prevent this in order to better control how the applied energy is directed, and to allow grid clear conditions for each pair of adjacent grids (which generally differ in the grid spacing, hole sizes, etc.) to be optimized. In alternative embodiments, other grid clear circuits may be used. For example, if the screen grid 202a is grounded and the accelerator grid 202b is connected to the grid clear power supply, voltage differences will exist simultaneously between the accelerator grid 202b and the screen grid 202a, as well as between the accelerator grid 202b and the grounded decelerator grid 202c. This could be used in a simple single-stage grid clear process to clear both the acceleration and deceleration gaps simultaneously. Alternatively, it could be implemented as the second stage of a two-stage process, in which the accelerator gap is first cleared in the first stage, e.g. using the circuit shown in FIG. 3A.

Although the above descriptions refer to a 3-grid ion optic assembly, it should be noted that in other embodiments, fewer or more grids can be employed, such as, e.g., a 2-grid or 4-grid ion optic assembly. Other features may be added to the grid clear circuit, such as a safety timer relay that would ensure that the power could not by some error be left on for more than a limited period of time.

In accordance with various disclosed embodiments, the grid short clearing system uses a localized glow discharge gas plasma to electrically clear grid shorts between adjacent grids by selecting a predetermined gas pressure and operating within a maximum potential difference between the grids for the grid clearing operation based on the following considerations:

The minimum pressure between the grids is at least sufficient to sustain a gas ionization plasma to clear the electrical short; this may be generally ensured for conventional grid optics designs by operating at a predetermined pressure above about 50 Torr;

The maximum pressure between the grids is just below one atmosphere, nominally less than or equal to about 750 Torr;

An electrical potential difference between the adjacent grids is applied using a current limited power supply;

The potential difference applied is less that the electrical breakdown voltage between grids with no contaminants, such that a direct grid-grid discharge is avoided.

One embodiment of a method of determining the electrical breakdown voltage between the grids is detailed in FIG. 4. In some embodiments, this procedure is performed prior to the need for any grid clearing operations on these units. In other embodiments, a grid assembly of the same design as that for which grid short clearing is required may be installed in an ion source coupled to a process chamber in an equivalent ion beam materials processing system. The absence of contaminants on the selected grids that may cause grid shorts in the end-use application, and prevent correct determination of the grid-grid breakdown voltage, can be verified before starting the breakdown voltage determination by adjusting the gas composition and pressure to approximately the same values used in the end use application; applying a potential difference between the adjacent grids of interest wherein the potential difference is approximately equal to the maximum voltage applied in the end use application; and ensuring that the primary source grid power supplies have reached their set points and are stable, and any grid currents are within normal low limits. Referring to FIG. 4, the breakdown voltage determination for the adjacent grids of interest begins at 401, with supplying a gas into the process chamber 205 if the chamber is evacuated. This may be done by venting the process chamber 205 to atmosphere using vent valve 208 or, by supplying a gas from the gas supply 210, which may be by fluid communication through the ion source 201 to the process chamber 205 via the gas controller 209. At 402, the predetermined gas pressure for the grid clearing operation of interest is set in the process chamber, which may be done by various methods, such as pumping down the process chamber with vacuum pump 207, controlling the flow of the gas into the process chamber from the gas supply 210 via the gas controller 209, or controlling the flow of gas into the process chamber from the gas supply 210 via the gas controller 209 while pumping down the process chamber with vacuum pump 207. At 403, a potential difference is applied between the pair of grids using a current limited power supply, which may be the grid clearing power supply if so equipped. The voltage on the power supply is increased at 404 until a glow discharge plasma is ignited between the grids. As discussed in reference to FIG. 1, ignition of a discharge can be indicated by various means, for example, on the current-limited power supply, ignition discharge is indicated by the power supply reaching maximum current at some voltage below the programmed voltage. The voltage sustained on the power supply will be the breakdown voltage of the discharge, as shown at 405.

In various embodiments, the maximum potential between the grids used for grid clearing may be derated by some factor, e.g. at least 10%-20%, below the breakdown voltage, in order to account for differences in tolerance and service conditions between the grid set used for setting the grid clearing conditions and the unit for which the procedure is to be applied. For example, if $V_b$ is about 1000V, the maximum allowed grid clearing potential may be 900V.

Figure 4B:
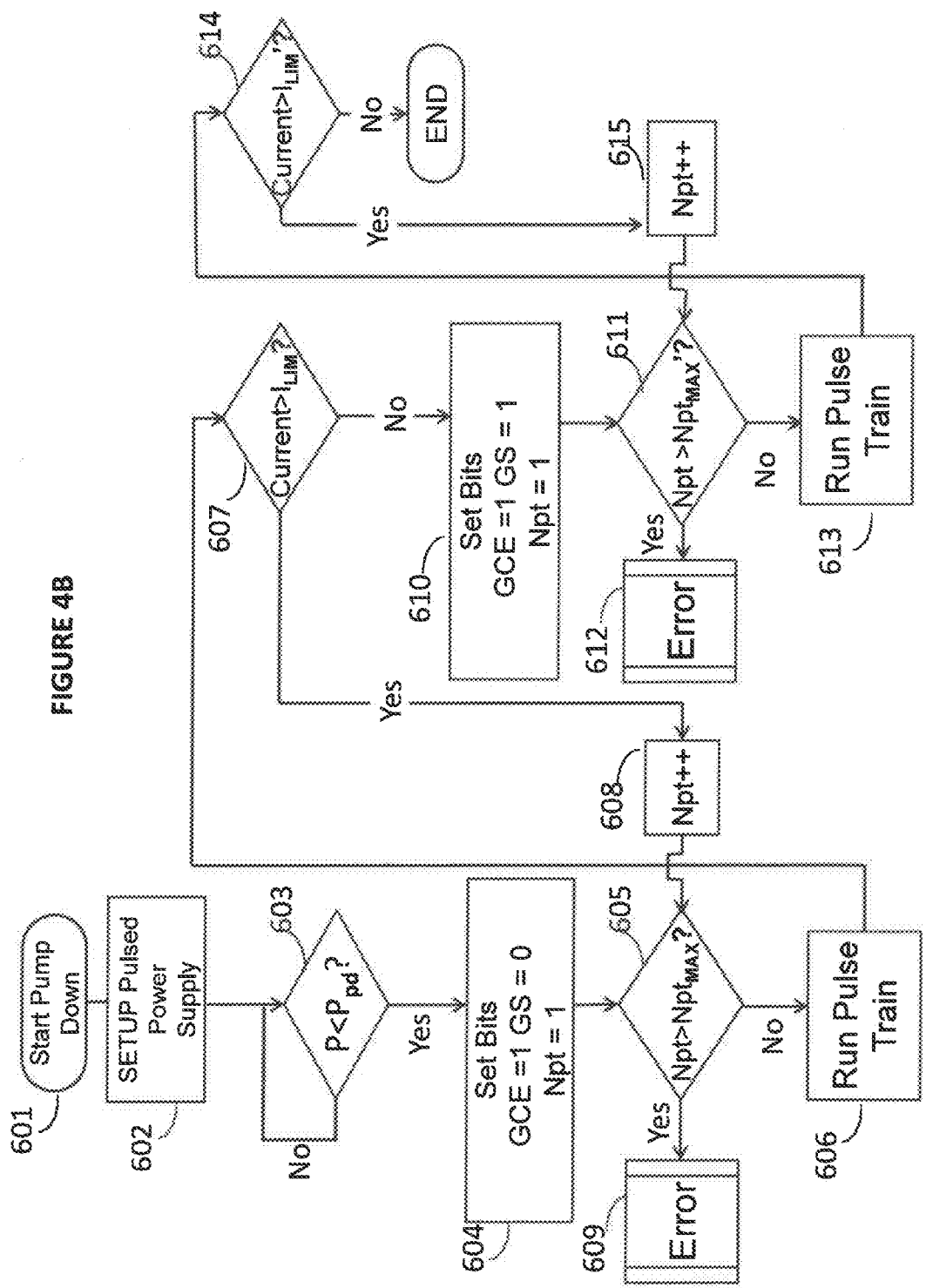
FIG. 4B is a flowchart illustrating an example method to clear electrical shorts from a 3-grid ion optic using a pulsed DC power supply capable of generating a train of electrical pulses according to another embodiment of the invention.

FIGS. 4A and 4B illustrate example process flows for different embodiment of the grid clearing method, applied to a 3-grid ion optic assembly. In a first stage, shorts are cleared between the screen grid 202a and accelerator grid 202b. In a second stage, shorts are cleared between the accelerator grid 202b and decelerator grid 202c. The order of the first and second stages may also be reversed. At each stage the grid short clear potential difference is applied by applying a voltage "pulse" (or train of pulses) to one of the grids. The success of the grid clear operation is determined by measuring the electrical current between the grids at the end of the voltage pulse (or pulse train). If a grid short is still detected, the grid clear operation is repeated, another grid clear pulse (or pulse train) is applied and again the current is measured. This loop may be continued for some iterations. Further details and various alternative embodiments are discussed below.

Referring to FIG. 4A, software is used to generate the grid clear "pulse" by turning the grid clear power supply on and off. The first step of the process is to set the pressure to within the required range, as determined from the above considerations. In this example, the process chamber 205 is initially assumed to contain a gas of the desired gas composition but at a pressure greater than the predetermined pressure "$P_{pd}$" for grid clearing (e.g. vented to atmosphere). A vacuum pumpdown is begun at 501 and the pressure is monitored by a pressure gauge such as 211 at 502. When the pressure reaches "$P_{pd}$", the Grid Clear circuit is enabled (GCE bit set to 1) at 503.

The next step is to set the GS bit controlling the grid clear circuit switches, such as switches 330, 331. For the first stage of grid clearing between grids 202a and 202b, the GS bit is first set to 0 at 503. A software variable counting the number of grid pulses "$N_p$" is set to 1. The software checks that $N_p$ is less than a predetermined limit $N_{pMAX}$ at 504, then turns on the grid clear power supply, which was preset to a specific pulse voltage $V_P$ and current limit $I_{PMAX}$ at 505. As described above, the pulse voltage $V_p$ was previously determined to be below the breakdown voltage for a direct grid-grid discharge between grid surfaces of the multi-grid ion optic design for the predetermined gas pressure, e.g. by the method of FIG. 4. Software then waits for a selected time "$T_p$" for the short to clear at 506. The actual grid clear power supply current at that time "I" is then checked at 507 to see if it is above some threshold value $I_{LIM}$ near zero, indicating that the grid short has not cleared. If so, $N_p$ is incremented by 1 at 508, and another grid clearing "pulse" is generated. This loop repeats until the current drops below $I_{LIM}$ or $N_p$ reaches a predetermined limit, $N_{pMAX}$. In the latter case, the grid clear attempt is determined to have failed and an error is generated by the software at 517. If the current drops below $I_{LIM}$, the next stage of the grid clearing operation is initiated at 509 and 510. The threshold current $I_{LIM}$ is determined by the maximum current between the grids that may normally be detected in the absence of grid shorts, mainly due to leakage through imperfectly insulators. It is typically on the order of a fraction of 1 mA. The power supply is turned off at 509. The GS bit is set to 1 and $N_p$ is reset to 1 at 510. This provides for a voltage difference to be applied between the accelerator grid 202b and decelerator grid 202c in order to clear any shorts between these grids. The procedure used in the first stage is repeated for the second stage in 511-516, except that the parameters $V_p'$, $I_{pMAX}'$, $N_{pMAX}'$, $T_p'$, AND $I_{LIM}'$ used for the second stage may be different than the corresponding parameters used in the first stage.

Typically, the grid clearing process is relatively short (e.g., on the order of seconds or minutes) compared to the rate of pump down (which is generally on the order of hours to reach vacuum range), so it is possible to perform the grid clearing operation without interrupting the pumpdown process. However, the control system may be programmed to halt the pumpdown at a specific pressure while the grid clearing operation is proceeding, or to maintain a constant pressure (pumping back as needed to compensate for leakback of air in the process chamber 205 when it is not being pumped).

The pressure setting procedure described above is convenient when the grid clearing operation is to be performed after the system is vented and before it is fully pumped down to the base pressure (typically less than $10^{-5}$ Torr) required for the ion beam process, for example, in an "air-to-air" system and process where the substrates to be processed are unloaded and reloaded at atmosphere. The gas composition will be close to that of the atmospheric environment. Alternatively, as discussed in reference to FIG. 4, process chamber 205 may be pumped down to a pressure less than the predetermined pressure $P_{PD}$ and then backfilled with gas to raise the pressure to the predetermined pressure $P_{PD}$. Gas may be supplied for this purpose from process gas supply 210 through the gas controller 209, or by leaking air into process chamber 205, e.g. through vent valve 208. This pumpback and backfill method may be convenient, for example, for a load locked system and process where the process chamber 205 is typically maintained under vacuum; it is further distinguished by the fact that it allows the gas composition for the grid clearing process to be specifically selected, which could improve the effectiveness or repeatability of the grid clearing process. In another embodiment, the gas may be allowed to continue to flow in the process chamber 205 to maintain a constant pressure with the vacuum pumping on the system, either continuously or alternately.

Furthermore, although not included in the process flow chart of FIG. 4A, a different predetermined pressure $P_{PD}'$ may be used for the second stage of grid clearing. This may be accomplished according to the methods described above.

FIG. 4B illustrates another embodiment of the grid clearing procedure, in which the grid clear power supply is a programmable power supply that directly generates one or more high voltage grid clear pulses. In various embodiments, a pulsed power supply may be beneficial for minimizing grid damage, as shall be described in the relevant discussion below. Also, a pulsed power supply provides simpler and more accurate control of the electrical pulse duration by avoiding turning the power supply on and off and any associated uncontrolled delay times. The pulse ramp up time can also be set. Failure detection (if the current $I<I_{LIM}$) would be done at least during the last pulse in the train; it may also be done and results noted for other pulses prior to the final pulse for process control feedback.

Similar to the procedure discussed with reference to FIG. 4A, at 601 a vacuum pumpdown is begun. Next at 602, the power supply is programmed to generate a train of one or more pulses, each pulse having a voltage $V_p$, current limit $I_{pMAX}$, pulse time $T_p$, and ramp up time $V_R$. The procedure then is similar to that described for FIG. 4A. The gas pressure is adjusted to the predetermined pressure "$P_{pd}$" at 603. At 604, the GCE bit is set to 1, the GS bit is first set to 0 for clearing the first pair of adjacent grids, and a counter variable for the number of grid pulse trains "$N_{pt}$" is set to 1. The software checks that $N_{pt}$ is less than a predetermined limit $N_{PtMAX}$ at 605. The software then enables the grid clear power supply 220 to send the pulse train at 608. Before the end of the last pulse in the pulse train, the current is compared to the threshold value $I_{LIM}$ at 607. If the current is too high (i.e., grid short is not cleared), $N_{Pt}$ is incremented by 1 at 608, and another train of pulses is sent. This loop repeats until the current drops below $I_{LIM}$ or $N_{Pt}$ reaches a predetermined limit, $N_{PtMAX}$. In the latter case, the grid clear attempt is determined to have failed and an error is generated at 609 indicating a grid clear failure. If the current drops below $I_{LIM}$, the next stage of the grid clearing operation is initiated at 610 (if required). The GS bit is set to 1 to enable a voltage difference to be applied between the accelerator grid 202b and decelerator grid 202c in order to clear any shorts between these grids, and counter variable $N_{pt}$ is reset to 1. The procedure used in the first stage is repeated for the second stage in 611-615, except that the parameters $N_{PtMAX}$ and $I_{LIM''}$ used for the second stage may be different than the corresponding parameters used in the first stage, depending on differences between the grids and effects of operating conditions.

In an alternative embodiment of FIG. 4B, the power supply can be completely reprogrammed between grid clear stages to provide a different set of grid clearing pulse parameters $V_p'$, $I_{pMAX}'$, $T_p'$, $T_R'$ and the pressure $P_{pd}'$ can be changed to optimize the process for the clearing shorts from the second pair of grids.

Although glow discharge plasma discharges are much less damaging than cathodic arcs used in conventional grid clearing methods, they can still damage grids, e.g. by localized overheating if applied under very high voltage or current or for extended periods of time. Limits to the grid clearing pulse voltage $V_p$, maximum current $I_{pMAX}$, pulse time $T_p$, and maximum number of pulses $N_{pMAX}$ are preferably based on testing (such as temperature monitoring, measurable grid damage) and experience. In preliminary testing, effective grid clearing has been observed for voltage $V_p$~1 kV, maximum current $I_{MAX}$~1 A-4 A, pulse time $T_p$~1 s, and number of pulses ~3. The ramp time, $T_R$~50 ms, was negligible compared to the pulse time. Each of these parameters can be increased if necessary for more effective grid clearing. The maximum limits are determined by the total power and time at power to which the grids are exposed.

The grid clearing pulse voltage may range from approximately 200 V to the limit of breakdown voltage between the grids with no contaminants described above, around 1 to 2 kV for the pressure range 50-750 Torr favorable for grid short clearing. In various embodiments, voltages above 400 V may better ensure ignition of a localized glow discharge. Very high voltage pulses can be avoided where possible to prevent arcing between grids as well as excessive dissipated power. In various embodiments, the maximum current may range from about 250 mA to 15 A, and the pulse time may range from about 0.25 s to 10 s. The maximum number of pulses may not be critical, as experience indicates that if the pulse current, voltage, and duration are limited, and if a grid clearing discharge is not generated for a given pulse, the grid temperature is not changed. Evidence of localized overheating of grids has been observed when grid clear currents exceeded 15 A or the grid clear duration time exceeded 10 s.

In various multi-stage embodiments, for each stage of operation, if a series of grid pulses at the same conditions are not successful in clearing the short, instead of ending with an error, the process may be re-run with one or more new parameters, $P_{pd}$, $V_p$, $I_{pMAX}$, $T_p$, or $T_R$. In particular, a grid short clearance failure may be overcome by increasing one or more of the following: the current limit of the power supply $I_{pMAX}$, the electrical potential difference between the adjacent grids $V_p$, or the time the electrical potential difference between the grids is applied, $T_p$.

In various embodiments, a method for minimizing possible discharge damage to the grids entails sending a sequence of pulses starting with a one or more pulses of relatively low current $I_{pMAX}$ and raising the pulse current in steps until the grid short is cleared, or a final limit on the maximum current is reached, as was done for the example data in FIG. 5. This allows clearing of grid shorts with just about the minimum current required in each case. A final limit would be determined by reaching the maximum power supply current rating, or a known threshold for serious grid damage. An alternative method for minimizing possible discharge damage to the grids entails sending a sequence of pulses starting with a one or more pulses of relatively low voltage $V_p$ (e.g., about 40V to −100V) and raising the pulse voltage in steps, until the grid short is cleared, or a maximum allowed potential difference between the grids is reached. Either of these methods may be implemented by generating pulse trains with a pulsed DC power supply, operated as generally described in the discussion of FIG. 4B.

Additional iterations of the pressure $P_{pd}$, may be attempted to clear different types of grid shorts, if the "usual" pressure is not effective in generating a discharge within the selected grid clear pulse power and time limits. As discussed above, the optimum pressure may be significantly lower for clearing high voltage shorts due to "needle-like" deposits on one of the grid plates than for clearing dead shorts and loose flakes, etc In various embodiments, one criterion for success of the grid clearing operation described above is no current flow above the minimal threshold $I_{LIM}$. An alternative electrical means would be to re-apply a voltage and measure the current or measure the circuit resistance after the grid clearing step. This may be sufficient to determine that there are no dead shorts between the grids; however, it does not guarantee there will be no high voltage shorts at the process conditions under which the ion source is actually operated. For example, in a manner similar to that described for the conventional grid clearing method, a dead short may be partially sublimed without a discharge being generated, leaving residual material within the time of a first effective pulse. This problem can be prevented in various embodiments by setting a pulse time longer than it typically takes to take to clear shorts, such that the high voltage gas discharge is more likely to form before the end of the pulse.

In other embodiments, after a dead short is determined by the circuit to have cleared, one or more additional pulse(s) are sent to better ensure that any residual material is removed. This can be done using a programmable power supply (as per the description of FIG. 4B) by launching a pulse train of at least two pulses in each cycle. Otherwise, the process flow could be modified such that after the grid clear criteria is met ($I<I_{LIM}$), and before continuing to the next step, an intermediate step is inserted in which at least one additional pulse is sent.

In other embodiments, the final success of the grid clearing operation is determined by detection of a plasma discharge event during the pulse. This information may be derived from the power supply output characteristics, an optical detector to capture the light emission (e.g. visual light flash), a microphone to detect the plasma discharge acoustic discharge noise, which may be audible, or other means. Grid clearing pulses of the same or different type may continue to be sent until the discharge is detected.

In yet another embodiment, the success of the grid clearing operation may be finally determined by checking for grid shorts at conditions closer to the actual process conditions (e.g. comparable grid voltage differences, gas type, and pressure).

Many gases can be used to generate a glow discharge suitable for grid clearing. As described above, air is convenient, especially for ion beam systems configured for "air to air" processing of substrates. Air, oxygen, or some gas composition including oxygen may also be preferable in the case of grid shorts that are composed of oxidizable materials such as carbon, to help "burn" them off. Other reactive gases may be advantageous depending on the chemical composition of the contaminant causing the electrical short. Alternatively, nitrogen or inert gases such as helium, argon, neon, xenon, or krypton or mixtures thereof may be preferred to reduce variations in the grid clearing operation and avoid maintenance issues that may result from the use of reactive gases.

Figure 5A:
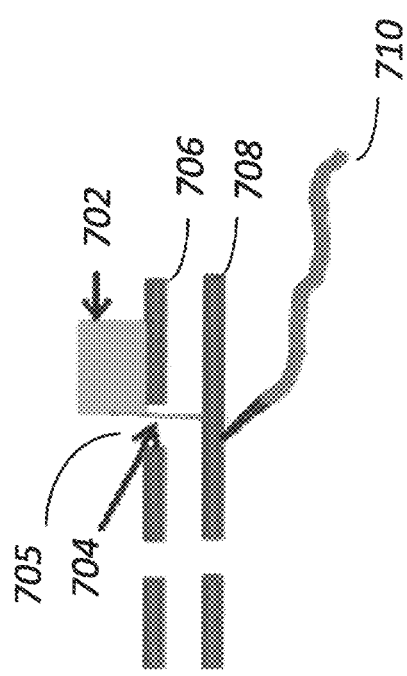
FIG. 5A schematically depicts a configuration for testing the clearing of a dead electrical short contact contamination between two grids, simulated by a wire.

To develop and test the effectiveness of the embodiments described here, a set of grids was modified to simulate grid shorts. FIG. 5A schematically shows a test configuration for simulating shorts between two grids. As illustrated, a wire 704 is threaded into a "wire holder" 702 which is mounted on the outside of an electrically grounded grid plate 706, and extended through one of grid apertures 705 to the surface of the second grid plate 708, which is connected to the grid clear power supply, such as grid clear power supply 220 or 320. A thermocouple 710 is placed on the opposite side of the charged grid (i.e., second grid plate 708) to monitor the grid temperature before and after the grid clear pulses. An ohmmeter is connected between the two grids before and after each pulse to determine the initial resistance of the short and if it changes. When there is no electrical short the resistance measured is 0.7 kOhm, the resistance of the grid clear power supply.

Figure 5B:
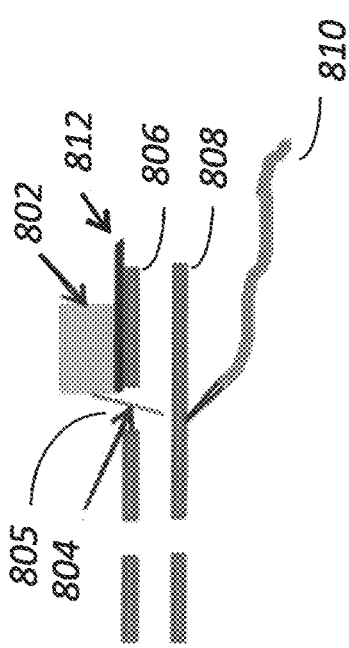
FIG. 5B schematically depicts a configuration for testing the clearing of an electrical short due to a needle-like contamination between two grids, simulated by a wire attached to one grid and separated from an adjacent grid by an adjustable gap.

FIG. 5B schematically shows a modification of this test configuration for simulating a "needle" (localized site of reduced grid spacing which may cause high voltage grid shorts at sub-mTorr pressures by arcing). In FIG. 5B, a wire 804 is first extended across the gap between the grids 806, 808 as in FIG. 5A. Shims 812 with different thickness are then placed between the wire holder 802 and the grounded grid 806 to create a spacing of the same amount between the tip of the wire and the electrically charged grid 808. A thermocouple 810 is placed on the opposite side of the charged grid (i.e., second grid plate 808). Stainless steel was used for wires 704 and 804 in these tests. Stainless steel is a common material used for shields and process chamber liners in ion beam etch systems, and is the single most common material exposed to the ion beam and found in deposition and flakes in the process chamber 205 and at the grids.

Results of a series of tests for clearing dead shorts generated with a wire of 0.0045" diameter in atmosphere, using the configuration of FIG. 5A, are tabulated in FIG. 5C. At the start of each test, the process module was vented, a test wire was extended between the grid plates until contact was verified (resistance less than ~100 Ohms). A programmable power supply was used to generate a 1 s, 1 kV pulse. The resistance after each pulse was checked. A change in resistance to 0.7 kOhm was an indication that the dead short had been cleared. However, as discussed above, because loss of electrical contact is not always sufficient to prevent high voltage shorts, a grid clear test was not considered successful unless a plasma glow discharge was detected by a visual optical signal (light flash) and/or audible acoustic signal. For the first test, the pulse current limit was set to 1 A and a single 1 A pulse successfully cleared the short. In test #2, a grid short remained after two 1 A pulses; it cleared on a third pulse, after increasing the maximum current to 2 A. Six additional tests were conducted at the 2 A maximum current. A single 2 A pulse was sufficient to clear shorts in all six subsequent trials. The grid temperature increased on average by less than 10 degrees Celsius for 2 A pulses and only a few degrees for 1 A pulses.

FIG. 5D shows corresponding test results for a thicker 0.009" wire. Test #1 started with 2 A pulses. After 3 pulses there was no improvement, as indicated by unchanged resistivity and grid temperature. The maximum current was then raised to 3 A. Success was achieved after two 3 A pulses. Test #2 started with 3 A pulses and the short cleared after two pulses. In test #3, however, after five 3 A pulses, the resistance was little changed; the maximum pulse current was increased to 4 A, then the short was cleared after two pulses. Tests #4 and #5 started with 4 A maximum pulses, and in both cases the short cleared after two 4 A pulses. The grid temperature increased by about 10 degrees C. for the 4 A pulse.

In general, this data supports the concept that in various embodiments successful grid clear operations require two steps. The first step is, by current heating, to convert the residual materials to a high resistivity short, e.g. a "needle" or loose flake. The second step is to generate a gas discharge to burn off this residual material. In the case where the current density in the grid short is very high, such as the 2 A, 1-s pulse through a 0.0045" wire, this may occur within the timespan of a single grid pulse. In other cases, such as the 4 A pulse through a 0.0009" wire, two 1-s pulses are generally required. More massive shorts may require either higher currents or more pulses.

It is notable that grid clear pulses that are (individually) not successful produce little or no change in grid temperature. Presumably, this is because the current passes through the short with little resistance and no discharge is generated. Thus, it appears that cumulative damage to the grids from multiple pulses is not a general concern. On the other hand, the results also suggest that if several grid pulses (grid clear attempts) at the same pulse conditions are unsuccessful, more are not effective. Raising the current of the grid pulses may be effective in these situations.

Similar tests to simulate clearing of "needles" that cause high voltage shorts, using the test configuration of FIG. 5B, are tabulated in FIG. 5E. The needle is simulated by a 0.009" wire. The results show that a single 4 A 1-s pulse could clear such a needle in a 0.004"-0.008" gap. The grid temperature increased by between 10-30 degrees C. It was not possible to clear a 0.0012" gap at these conditions, even after repeated attempts. It may be that the grid clearing of this needle could be done using a reduced pressure, higher voltage, or higher current.

Figure 6A:
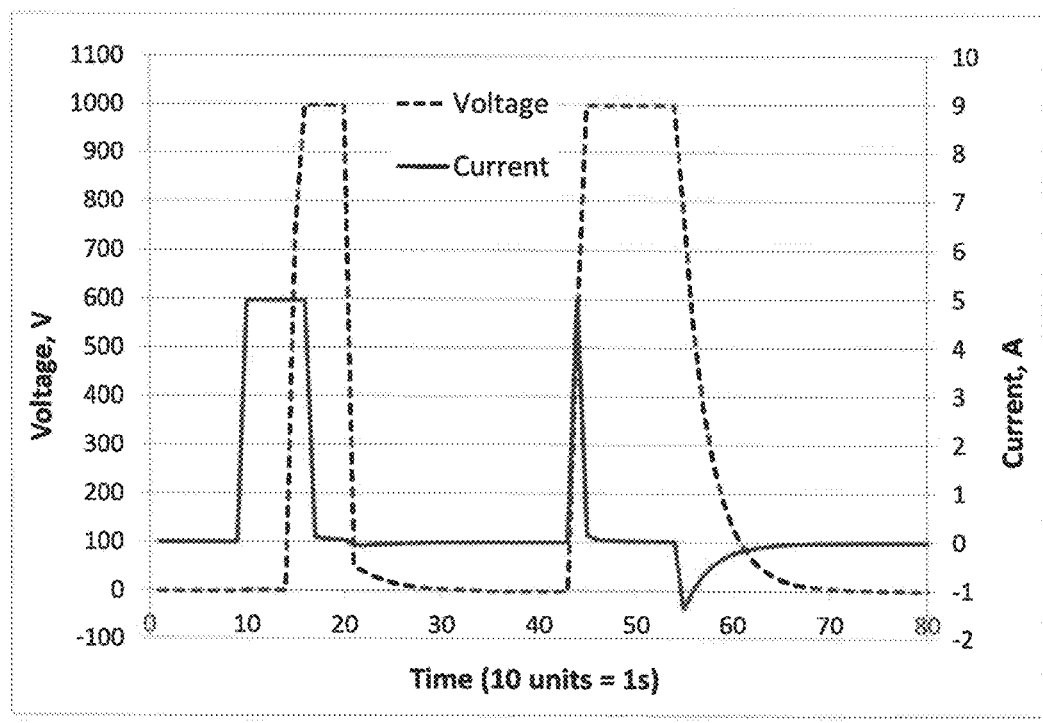
FIGS. 6A and 6B show oscilloscope traces of the current and voltage traces obtained at the output of the grid clear power supply as depicted in FIG. 3A during a grid clearing procedure implemented on a grid assemblies having actual contaminant-caused grid electrical shorts.
Figure 6B:
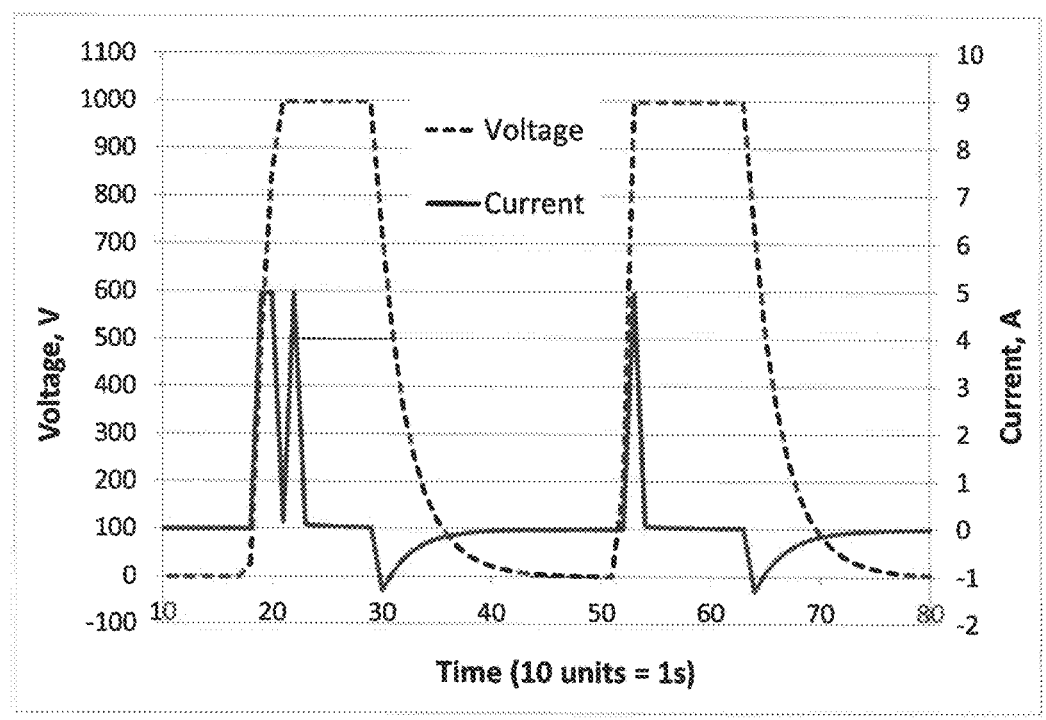

FIGS. 6A and 6B show time-dependent voltage and current oscilloscope traces obtained at the high voltage output of a grid clear power supply while clearing the grids of actual contamination caused grid shorts. 1 kV, 5 A maximum 1-s pulses were used. Referring to FIG. 6A, the grid short was due to a flake, the resistance between the grids was initially ~1.6 Ohm. During the first pulse, the current quickly ramped to the 5 A max. limit. The voltage initially was negligible on the scale of 1 kV, indicating that a low resistance grid short was being maintained. Then the voltage suddenly ramped to the maximum 1 kV, and the current dropped to 0, the sign that the grid short had cleared. This conclusion that the grid short was cleared was confirmed by the traces for the second pulse, which are indicative of a clean pair of grids: the pair of grids act as a large capacitor, which charges at the beginning of the pulse then discharges at the end of the pulse. FIG. 6B shows the effect of clearing another flake with an initial resistance of ~11 Ohm. In this case, at the beginning of the first pulse both the voltage and current ramped up until the max 5 A current was reached. The resistance increased to hundreds of Ohms. Then the current dropped off while the voltage continued to rise until the 1 kV set point was reached. This indicates that the resistance of the short increased quickly as the current started to flow, then the short cleared. After this, the grid capacitance effect is observed within the same pulse time. The second pulse again is indicative only of capacitive charging of the grid plates.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

The invention claimed is:

1. A method for clearing electrical shorts caused by the presence of grid contaminants such as flakes or needle-like deposits between adjacent grids of a multiple-grid ion optic of an ion source coupled to a process chamber in an ion beam system comprising:
   supplying a gas into the process chamber;
   setting the gas pressure in the process chamber to a predetermined pressure ranging from about 50 Torr to about 750 Torr;

applying an electrical potential difference for a period of time between said adjacent grids using a current-limited power supply; and detecting whether the grid electrical short is cleared;

wherein the applied electrical potential difference between the adjacent grids is at least 10% lower than the DC electrical breakdown voltage between adjacent grids with no contaminants.

2. The method of claim 1 wherein the DC electrical breakdown voltage between adjacent grids with no contaminants is determined by:

supplying a gas into the process chamber;

setting the gas pressure in the process chamber to the predetermined pressure ranging from about 50 Torr to about 750 Torr;

applying an electrical potential difference between said adjacent pair of grids using a current-limited power supply;

increasing the voltage on the power supply until a gas plasma discharge between the grids is ignited;

identifying the power supply voltage at discharge as the electrical breakdown voltage.

3. The method of claim 1, further comprising repeating the steps of applying the electrical potential difference and detecting whether the grid electrical short is cleared, in response to detecting the grid electrical short, indicating a grid short clearance failure.

4. The method of claim 1 wherein the current limit for the power supply is less than or equal to 15 A.

5. The method of claim 4 wherein the current limit for the power supply ranges from about 0.25 A to about 15 A.

6. The method of claim 1 wherein the time that the electrical potential difference between the adjacent pair of grids is applied is less than or equal to 10 seconds.

7. The method of claim 3, which further comprises, in response to a grid short clearance failure, increasing one or more of the following: the current limit of the power supply, the electrical potential difference between the adjacent grids, or the time the electrical potential difference between the grids is applied.

8. The method of claim 1, wherein the step of setting the gas pressure is selected from the group consisting of: pumping down the process chamber with a vacuum pump, controlling the flow of the gas into the process chamber, or controlling the flow of gas into the process chamber while pumping down the process chamber with a vacuum pump.

9. The method of claim 1, wherein the step of applying an electrical potential difference between said adjacent grids comprises increasing the electrical potential difference in sequential steps from a starting voltage from about 40 V to about 100 V up to a maximum potential difference at least 10% less than the DC electrical breakdown voltage between the grid surfaces with no contaminants.

10. The method of claim 1 wherein the gas is selected from the group consisting of air, oxygen, nitrogen, helium, neon, argon, krypton, xenon, or combinations thereof.

11. The method of claim 1 wherein the multiple grid ion optics comprises a first adjacent grid pair between a screen grid and an accelerator grid and a second adjacent grid pair between the accelerator grid and a decelerator grid, and wherein applying the electrical potential difference between the adjacent pair of grids comprises activating a switching circuit to selectively couple a high voltage from a secondary power source to at least one of the grids in the adjacent grid pair and the other grid to a system electrical ground.

12. The method of claim 1, wherein detecting whether the grid electrical short is cleared comprises monitoring an electrical current between the adjacent grids and determining if the electrical current decreases to below a threshold value before the potential difference is removed.

13. The method of claim 1 wherein detecting whether the grid electrical short is cleared is selected from the group consisting of: detecting output characteristics of the power supply corresponding to generation of a plasma glow discharge, detecting an audible acoustic representative of generation of a plasma glow discharge, or detecting a visible optical signal representative of generation of a plasma glow discharge.

14. The method of claim 1, wherein the multiple grid ion optics includes a first adjacent grid pair comprising a screen grid and an accelerator grid and a second adjacent grid pair comprising the accelerator grid and an electrically grounded decelerator grid wherein:

the adjacent screen grid and accelerator grids are cleared by applying a voltage to the screen grid and connecting the accelerator grid to a system electrical ground to generate a potential difference between the screen grid and accelerator grids; and the adjacent accelerator and decelerator grids are cleared by applying a voltage to the accelerator grid and applying the same voltage to the screen grid to generate a potential difference only between the accelerator and the grounded decelerator grids.

15. An ion beam materials processing system comprising:

an ion source equipped with multi-grid ion optics coupled to a process chamber;

a gas supply for supplying gas into the process chamber, the process chamber having a gas pressure ranging from about 50 Torr to about 750 Torr;

a grid short clearing circuit including one or more primary power sources for conventional ion beam operation and a secondary power source for clearing grid electrical shorts coupled to a switching circuit, the secondary power source configured to apply a potential difference between adjacent grids operable from least 40 V up to a maximum potential difference to be used for grid short clearing.

16. The ion beam materials processing system of claim 15, wherein the multi-grid ion optics is a 3-grid ion optic assembly comprising a screen grid, an accelerator grid, and an electrically grounded decelerator grid.

17. The ion beam materials processing system of claim 16, wherein the switching circuit comprises a first switch and a second switch such that:

when both switches are turned off the screen grid and accelerator grids are connected to the screen grid and accelerator grid primary power sources and the secondary power source is not connected to any of the grids;

when the second switch is turned on, a grid clear voltage is applied to the screen grid and the accelerator grid is electrically grounded to apply a potential difference between the screen grid and the accelerator grid to clear a grid electrical short in an acceleration gap between the screen grid and the accelerator grid, regardless of whether the first switch is turned on or off; and when the first switch is turned on and the second switch is turned off, a grid clear voltage is applied to the accelerator grid and the screen grid to apply a potential difference only between the accelerator grid and the grounded decelerator grid, to clear a grid electrical short in a deceleration gap between the accelerator grid and the decelerator grid.

* * * * *